United States Patent
Luttikhuis et al.

(10) Patent No.: US 7,126,664 B2
(45) Date of Patent: Oct. 24, 2006

(54) LITHOGRAPHIC APPARATUS AND A DEVICE MANUFACTURING METHOD

(75) Inventors: Bernardus Antonius Johannes Luttikhuis, Nuenen (NL); Petrus Rutgerus Bartray, Ysselsteyn (NL); Johannes Henricus Wilhelmus Jacobs, Eindhoven (NL); Thijs Harink, Eindhoven (NL); Paulus Martinus Maria Liebregts, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 151 days.

(21) Appl. No.: 10/888,513

(22) Filed: Jul. 12, 2004

(65) Prior Publication Data

US 2006/0007414 A1    Jan. 12, 2006

(51) Int. Cl.
 *G03B 27/52*   (2006.01)
 *G03B 27/42*   (2006.01)
 *G03B 27/62*   (2006.01)
(52) U.S. Cl. .............................. 355/30; 355/53; 355/75
(58) Field of Classification Search .................. 355/30, 355/53, 67, 75
See application file for complete search history.

(56) References Cited

U.S. PATENT DOCUMENTS

| 6,333,775 | B1 * | 12/2001 | Haney et al. ................. 355/30 |
| 6,545,745 | B1 * | 4/2003 | Haney et al. ................. 355/30 |
| 6,842,221 | B1 * | 1/2005 | Shiraishi ....................... 355/30 |
| 2005/0275835 | A1 * | 12/2005 | Sogard ..................... 356/237.2 |

* cited by examiner

*Primary Examiner*—Henry Hung Nguyen
(74) *Attorney, Agent, or Firm*—Pillsbury Winthrop Shaw Pittman LLP (57) ABSTRACT

A lithographic apparatus is disclosed. The apparatus includes a support constructed to support a patterning device, the patterning device being capable of imparting a radiation beam with a pattern in its cross-section to form a patterned radiation beam. A projection system is configured to project the patterned radiation beam onto a target portion of a substrate. A first vacuum environment contains the projection system, a second vacuum environment contains the patterning device support, and a separator separates the first and second vacuum environments. The separator includes an aperture for passing the projection beam from the first vacuum environment towards the patterning device and/or vice-versa. The patterning device forms at least part of a seal for substantially sealing the aperture of the separator.

29 Claims, 8 Drawing Sheets

LITHOGRAPHIC APPARATUS AND A DEVICE MANUFACTURING METHOD

FIELD

The present invention relates to a lithographic apparatus, a method for manufacturing a device, and a device manufactured thereby.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

U.S. Pat. No. 6,333,775, which is incorporated herein by reference, describes a lithographic apparatus, including multiple pressure zones for controlling particle contamination on the reticle and carbon contamination of optical surfaces of optical surfaces. The known system includes a vacuum apparatus that includes various compartments that are maintained at different pressures. One of the compartments is a reticle zone which encases a reticle stage. Below the reticle zone, an optics zone is provided which encases projection optics devices. A reticle metrology tray separates the reticle zone from the optics zone. The reticle zone is maintained at a vacuum pressure of less than about 100 mTorr and preferably at about 30 mTorr. The optics zone is maintained at a vacuum pressure of less than about 5 mTorr. A seal assembly provides a gas limiting seal at the outer perimeter of the reticle metrology tray. The center of the reticle metrology tray includes an aperture through which light beams enter and exit. During use, about 200 L/s (litres per second) gas flows through this aperture from the reticle zone into the optics zone.

In the known apparatus, the reticle stage is kept in a reticle zone, partially separated from the projection optics. Therefore, the volume of the optics zone can be relatively small, including a relatively small number of components, compared to an apparatus wherein the reticle stage and the projection optics are located in the same vacuum environment. Consequently, the optics zone can be pumped down to a desired vacuum level relatively fast.

A disadvantage of the known lithography apparatus is that a relatively large amount of contamination can still reach the optics zone from the reticle zone via the aperture. Such contamination, for example, small particles, hydrocarbon and/or water, may hamper the operation of the optics, as well as spoil the optics as such. This hinders a respective device manufacturing method, leading to relatively expensive and/or low-quality devices manufactured thereby.

SUMMARY

It is an aspect of the invention to provide a lithographic system in which contamination of the projection optics may be prevented.

It is an aspect of the invention to provide a lithographic manufacturing method in which contamination of the projection optics may be prevented.

It is an aspect of the invention to provide relatively inexpensive and/or high quality devices manufactured by a lithographic apparatus and/or by a lithographic manufacturing method.

According to an aspect of the invention, a lithographic apparatus includes a support constructed to support a patterning device. The patterning device is capable of imparting a radiation beam with a pattern in its cross-section to form a patterned radiation beam. The apparatus also includes a projection system configured to project the patterned radiation beam onto a target portion of a substrate, a first vacuum environment containing the projection system, a second vacuum environment containing the patterning device support, and a separator separating the first vacuum environment and the second vacuum environment. The separator includes an aperture for passing the projection beam from the first vacuum environment towards the patterning device and/or vice-versa. The patterning device forms at least part of a seal for substantially sealing the aperture of the separator.

Therefore, contamination of the projection system may be prevented relatively well, leading to lower system downtimes, longer optics lifetimes, better apparatus performance and improved devices that are manufactured on the above-described apparatus. At least the reticle may be used in the sealing of the projection beam aperture of the separator, which may lead to a significant reduction of contamination of the first vacuum environment. Particularly, in this way, relatively low levels of water and hydrocarbon may be achieved in the first vacuum environment, thus preventing contamination of the projection system.

According to an aspect of the invention, there is provided a lithographic apparatus that includes a first vacuum chamber and a second vacuum chamber which is separated from the first vacuum chamber. The first vacuum chamber includes a projection system for projecting a patterned beam onto a target portion of a substrate. The second vacuum chamber includes a support for supporting and moving a patterning device in sight of the projection system.

According to an aspect of the invention, there is provided the use of the apparatus described above in the manufacturing of devices.

According to an aspect of the invention, there is provided the use of an apparatus described above in the manufacturing of devices, in which the patterning device is scanned between at least a first and a second position for imparting a pattern to the radiation beam.

According to an aspect of the invention, there is provided a device manufacturing method that includes projecting a patterned beam of radiation onto a substrate. A first vacuum environment that contains a projection system is kept at a certain first pressure. A second vacuum environment that contains a support for supporting a patterning device is kept at a certain second pressure. The patterning device is held at least partially near an aperture that extends between the first and second vacuum environment, for sealing that aperture. This may also lead to the above-mentioned advantages.

According to an aspect of the invention, a device manufacturing method is provided. The method includes patterning a beam of radiation with a patterning device, and projecting the patterned beam of radiation onto a substrate with a projection system. A first vacuum chamber that contains the projection system is separated from a second vacuum chamber that contains a support for the patterning device. The beam of radiation is transmitted via at least one aperture from the first vacuum chamber to the patterning device, and from the patterning device to the first vacuum chamber, and at least one aperture is substantially sealed by a seal.

According to an aspect of the invention, in a device manufacturing method, a first vacuum chamber that contains a projection system is separated from a second vacuum chamber that contains a support for a patterning device. A projection beam is transmitted via at least one aperture from the first vacuum chamber to the patterning device, and from the patterning device to the first vacuum chamber and projected by the projection system onto a substrate. The aperture is substantially sealed by a seal.

According to an aspect of the invention, a device manufacturing method using a lithographic apparatus includes patterning a beam of radiation with a patterning device, and projecting the patterned beam of radiation onto a target portion of a substrate with a projection system. A first part of the apparatus that includes at least part of the projection system is disposed in a first vacuum environment. A second part of the apparatus is disposed in a second vacuum environment, and at least part of a surface of the patterning device is used for sealing an aperture that extends between the first vacuum environment and the second vacuum environment.

According to an aspect of the invention, a device manufacturing method includes: providing a substrate; providing a projection beam of radiation using an illumination system; using a patterning device to impart the projection beam with a pattern in its cross-section; and projecting the patterned beam of radiation onto a target portion of the substrate. At least a first part of the apparatus that includes part of the projection system is disposed in a first vacuum environment. At least a second part of the apparatus is disposed in a second vacuum environment. At least part of a surface of the patterning device is used for sealing an aperture that extends between the first vacuum environment and the second vacuum environment.

According to an aspect of the invention, there is provided a device manufactured using the apparatus described above and/or according to the method described above.

According to an aspect of the invention, a computer, computer program and/or computer program product, arranged for controlling a lithographic apparatus to carry out a device manufacturing method is provided.

According to an aspect of the invention, a computer readable medium is provided. The medium is encoded with a sequence of programmed instructions which when executed by a processor are operable to cause a lithographic apparatus to pattern a beam of radiation with a patterning device; and project the patterned beam of radiation onto a target portion of a substrate with a projection system. A first part of the apparatus that includes at least part of the projection system is disposed in a first vacuum environment. A second part of the apparatus is disposed in a second vacuum environment, and at least part of a surface of the patterning device is used for sealing an aperture that extends between the first vacuum environment and the second vacuum environment.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
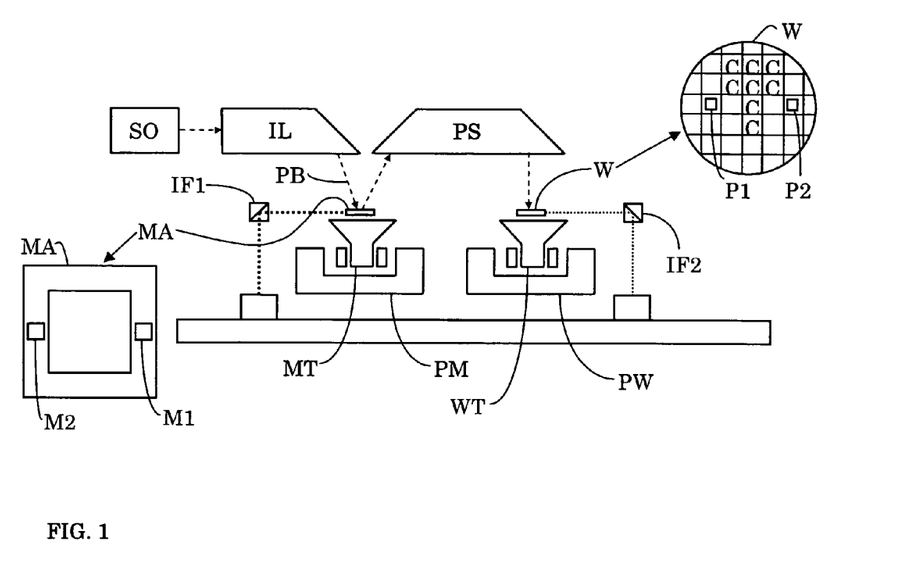
FIG. 1 depicts a lithographic apparatus according to an embodiment of the invention.

FIG. 1 schematically depicts a lithographic apparatus according to one embodiment of the invention. The apparatus includes: an illumination system (illuminator) IL configured to condition a radiation beam B (e.g. UV radiation or EUV radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as, for example, whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

Any use of the terms "reticle" or "mask" herein may be considered synonymous with the more general term "patterning device."

The term "patterning device" as used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example, if the pattern includes phase-shifting features or so-called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" as used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases, the source may be an integral part of the lithographic apparatus, for example, when the source is a mercury lamp. The source SO and the illuminator IL, together with the beam delivery system BD, if required, may be referred to as a radiation system.

The illuminator IL may include an adjuster AD for adjusting the angular intensity distribution of the radiation beam. Generally, at least the outer and/or inner radial extent (commonly referred to as s-outer and s-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus may be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
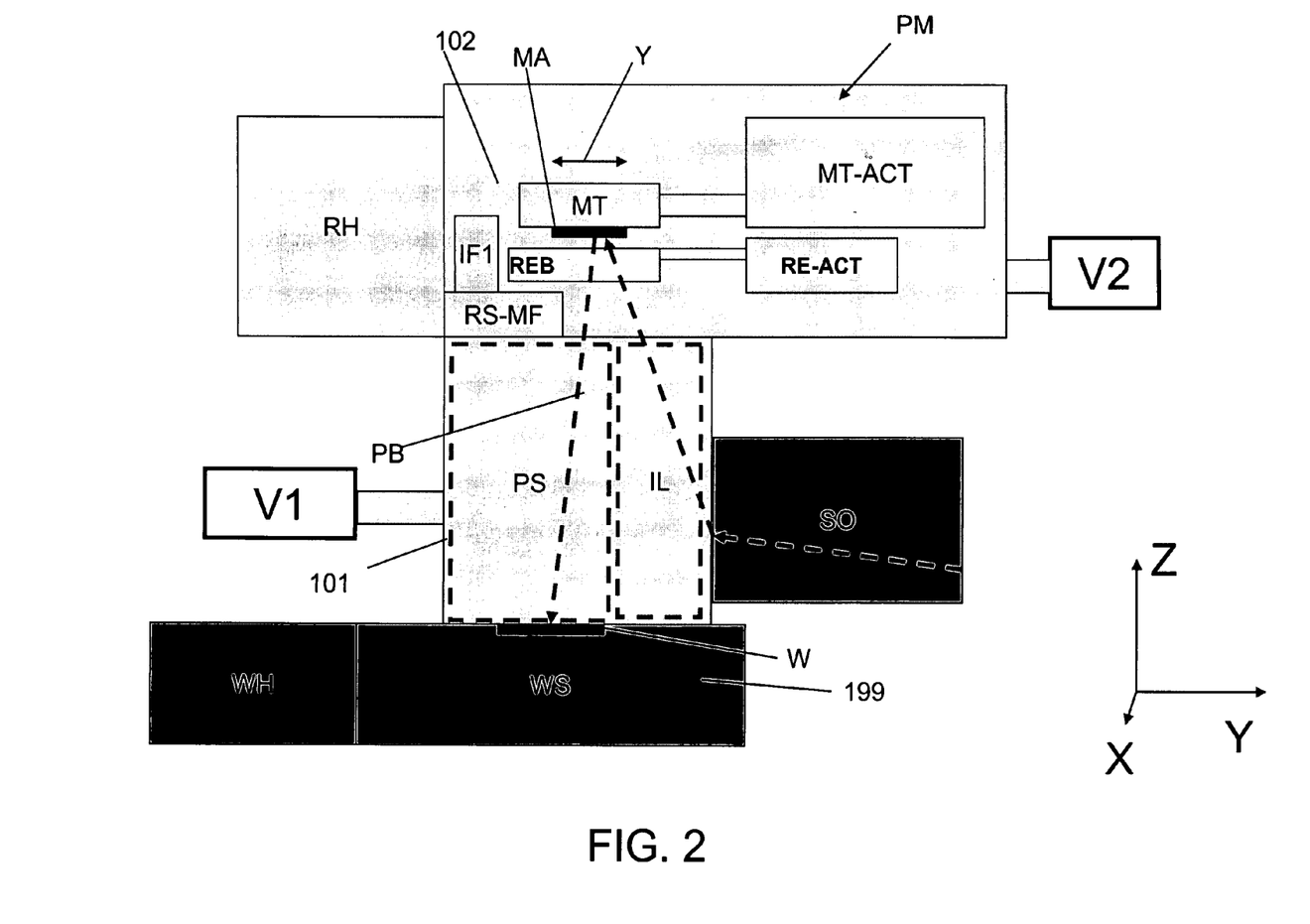
FIG. 2 schematically depicts pressure zones of a lithographic apparatus.

FIG. 2 shows a diagram of a lithographic apparatus, that includes a reticle zone 102, a projection optics zone 101 and a wafer zone 199.

The optics zone 101 includes the projection optics system PS, as well as the illuminator IL. The wafer zone 199 includes the wafer stage WS and a wafer handler WH for transporting the wafers W.

The reticle zone 102 includes a reticle handler RH, a reticle support structure MT, a reticle stage actuator module MT-ACT, Rema-blades REB and a reticle stage metrology frame RS-MF. The first positioner PM, which includes both the reticle stage short stroke and long stroke module, is, for example, an integral part of the reticle support structure MT and the reticle actuator module MT-ACT. The reticle handler RH serves to transport reticles MA into and out of the apparatus. Positioning sensors IFI of a reticle stage measurement system are provided in the reticle zone 102.

The reticle support structure is arranged to scan the reticle MA at least over a desired distance in Y directions with respect to the optics that are located in the optics zone 101. Herein, movement of the mask table MT is realized with the aid of the long-stroke module (coarse positioning) and the short-stroke module (fine positioning) of the first positioner PM. The long stroke module may provide movement in the Y-direction only, whereas the short stroke module may provide positioning in 6 degrees of freedom.

The rema blades REB serve to limit the width of the size of the exposure dimensions. The construction and functioning of such blades REB is generally known in the field of lithography.

Additional and/or other optic functionalities may be placed between the reticle MA and the projection optics PS, if desired.

Inside the reticle zone 102, a Rema blade actuation module RE-ACT is provided. This actuation module serves to control the position of the Rema blades REB for providing a desired scan slit of the exposure field.

The reticle stage metrology frame RS-MF is also located within the reticle zone 102. As is shown in FIG. 2, this metrology frame RS-MF is arranged for allowing the projection beam PB to pass from the illuminator IL to the reticle MA, and from the reticle MA to the projection system PS.

As is shown by light shading in FIG. 2, the reticle zone 102 and optics zone 101 are in the same vacuum environment, having a relatively low pressure during use. Both the reticle zone 102 and optics zone 101 also have about the same partial pressures of water vapor and hydrocarbon. One or more vacuum pumps V1, V2 are provided for pumping the optics zone 101 and reticle zone 102 down to a certain vacuum level, and for maintaining the vacuum therein.

The wafer zone 199 may (as source) have a higher partial vacuum regime than the illuminator/optics for water and hydrocarbons, which is shown by a darker shading.

The functioning of the apparatus of FIG. 2 is substantially the same as the above-described functioning concerning the apparatus of FIG. 1. A disadvantage of the apparatus of FIG. 2 is that the low pressure region, which includes the reticle zone 102 and the optics zone 101, is relatively large, which makes it relatively difficult and time-consuming to pump this region down to a desired vacuum level. Particularly, it takes a relatively large effort to remove water and/or hydrocarbons from the optics zone 101, while large pump capacity is needed of a large outgassing contributing from the reticle zone compartment 102.

Figure 3:
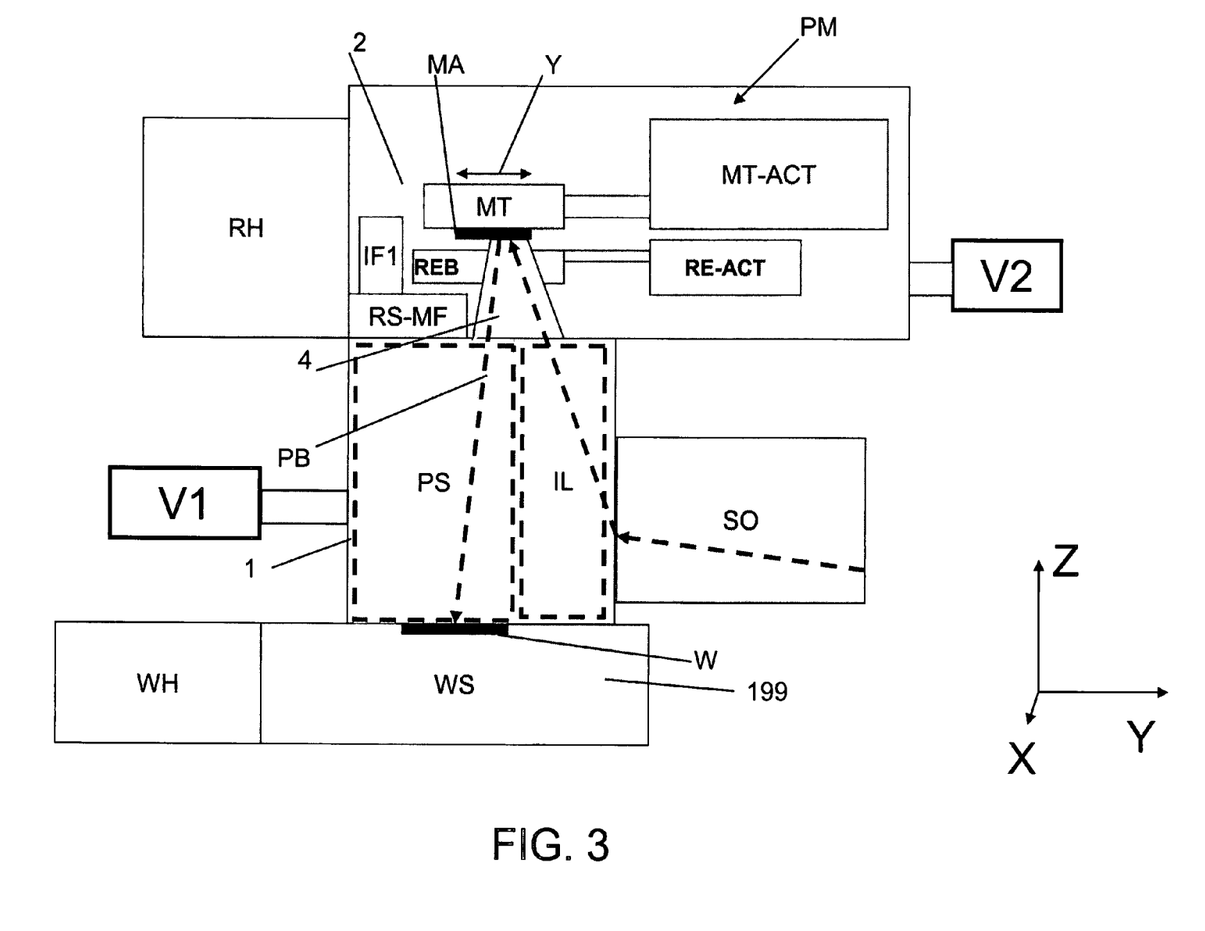
FIG. 3 schematically depicts pressure zones of the lithographic apparatus of FIG. 1.
Figure 4:
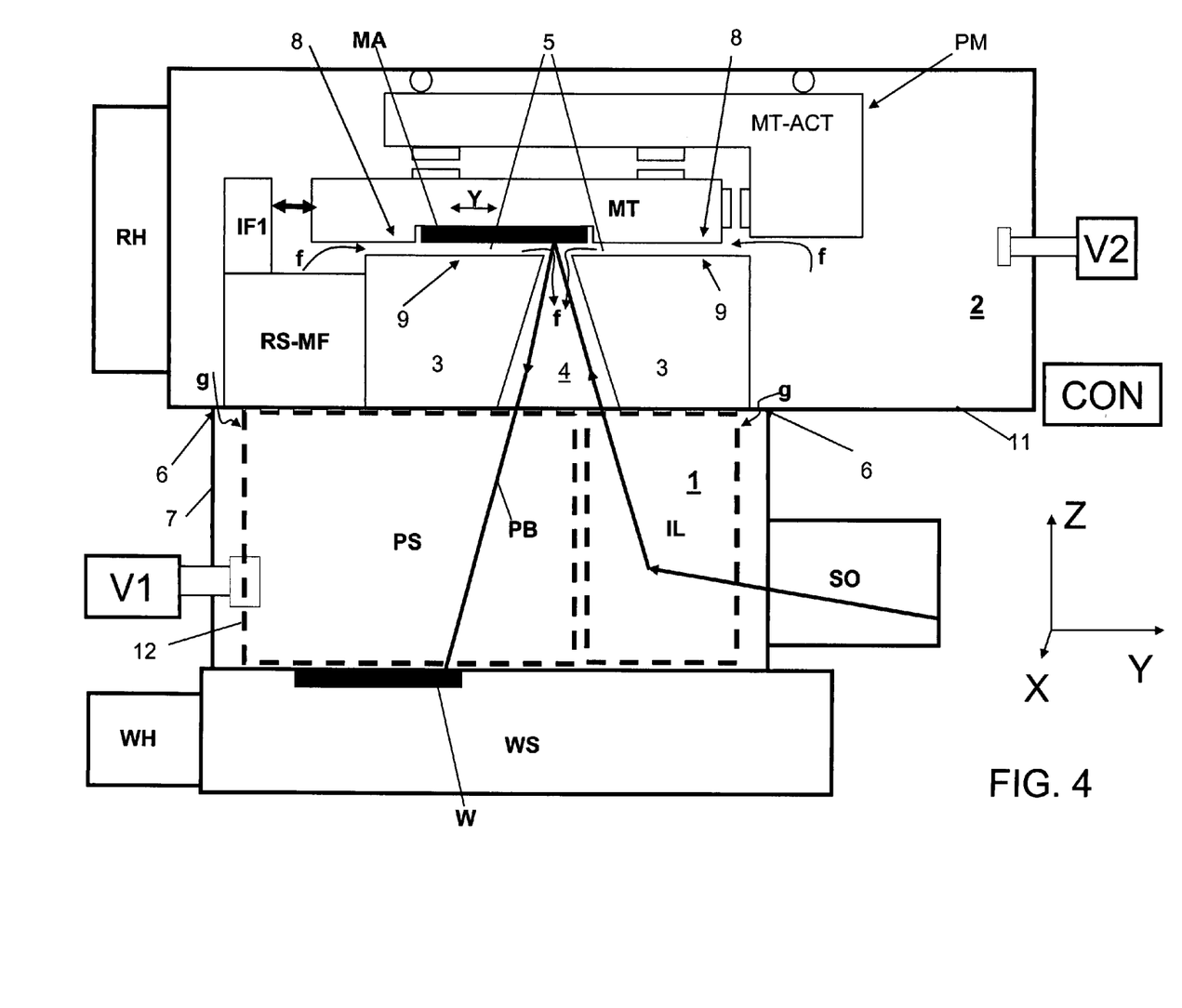
FIG. 4 depicts a cross-section of the apparatus according to the embodiment of FIG. 3, showing the sealing of the first vacuum environment from the second vacuum environment, wherein the reticle is in a first scan position.
Figure 5:
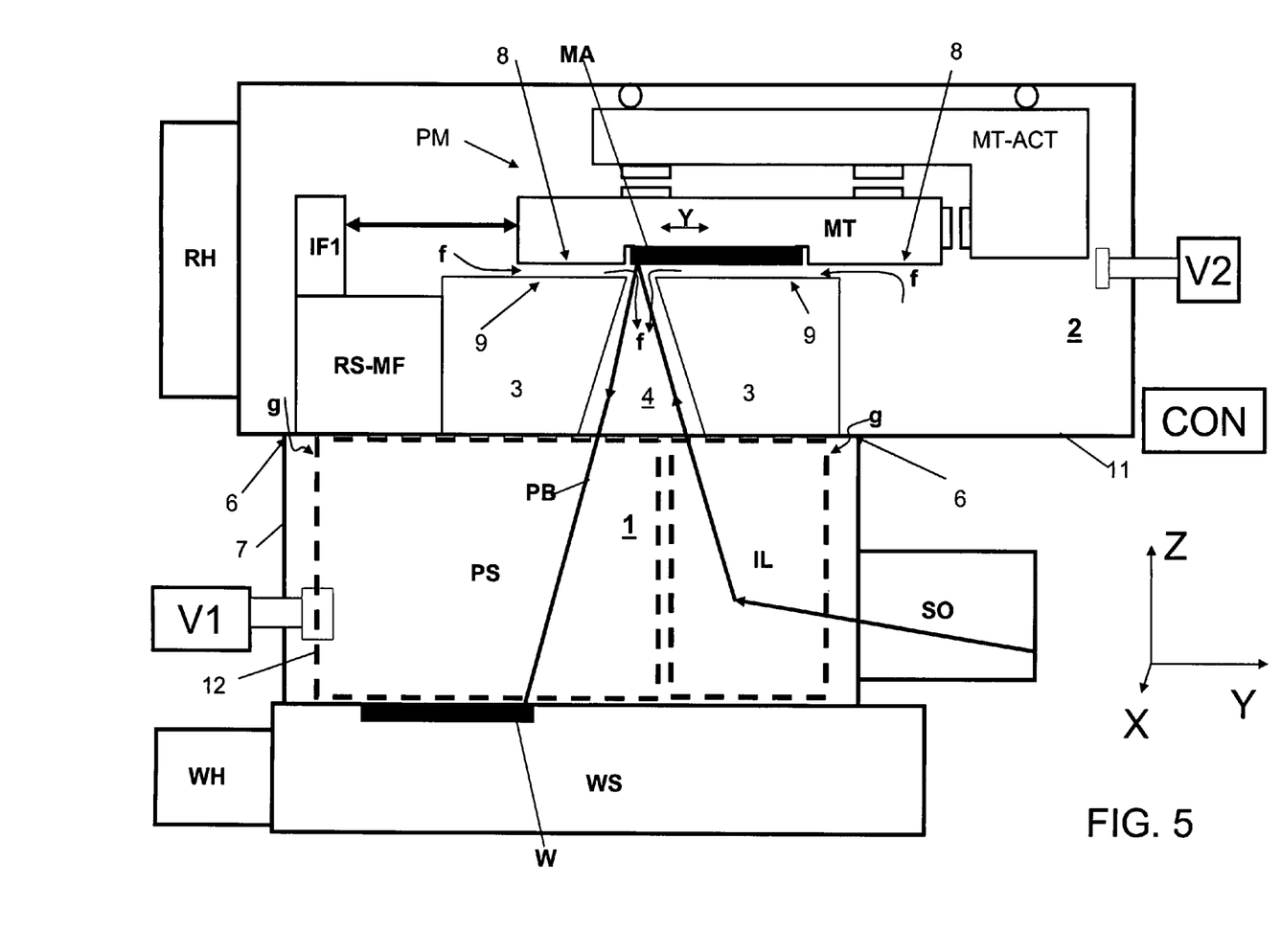
FIG. 5 depicts a cross-section of the apparatus according to the embodiment of FIG. 3, showing the sealing of the first vacuum environment from the second vacuum environment, wherein the reticle is in a second scan position.

FIG. 3 schematically shows an apparatus according to an embodiment of the present invention. FIGS. 4 and 5 show part of this embodiment in more detail. The apparatus of FIGS. 3–5 includes a first vacuum chamber 11 for providing a first vacuum environment 1 with a first pressure during use. The first chamber 11 contains an illumination system IL as well as a projection system. The illumination system IL is configured to condition a radiation beam, and the projection system is configured to project a patterned radiation beam PB onto a target portion of a substrate W. A second vacuum chamber 12 that has a second vacuum environment 2 with a second pressure during use is also provided. The second chamber 12 contains a reticle support constructed to support the reticle MA, the reticle MA being capable of imparting a radiation beam with a pattern in its cross-section to form the patterned radiation beam, and a separator construction (or separator) 3 separating the first vacuum environment 1 and the second vacuum environment 2. The separator construction 3 includes a projection beam aperture 4 for passing the projection beam PB from the first vacuum environment 1 towards the patterning device MA and vice-versa.

In FIG. 3, the reference sign PS denotes the location of the projection system. The separator construction 3 may be arranged and formed in various ways. In the present embodiment, the reticle stage metrology frame RS-MF is arranged for providing at least part of the separator construction 3.

Similar to the apparatus of FIG. 1, the present embodiment of FIGS. 3–5 further includes a substrate handler WH, as well as a substrate table-in a wafer stage WS—which is constructed to hold the substrate W. The apparatus may also include a computer, computer program, or computer program product, arranged for controlling the lithographic apparatus. Such a controller is schematically depicted in FIGS. 4 and 5 by a box with reference sign CON.

As is shown in FIGS. 4 and 5, one or more first vacuum pumps V1 are provided for realizing the first pressure of the first vacuum environment 1. One or more second vacuum pumps V2 are provided for realizing the second pressure of the second vacuum environment 2. The vacuum pumps V1, V2 as such are known to the skilled person, and may be coupled to the apparatus in various ways.

FIGS. 4 and 5 show two different positions of the reticle MA, respectively. The reticle support MT is arranged for moving the patterning device MA at least over a certain distance in a direction Y. To this aim, the reticle support MT is movable over the distance by the first positioner PM. The distance is, for example, in the range of 0.0–0.4 m, depending— amongst others— on the size of the reticle MA. Also, as follows from FIGS. 3–7, the reticle support MT is arranged for supporting and moving the reticle MA such that the reticle MA is scanned in sight of the projection system of the projection system PS during use.

The separator construction 3 can be arranged in various ways, and may include, for example, a suitable separation wall extending between the vacuum chambers, or the like. The projection beam aperture 4 extends through the separator construction 3, in sight of the reticle MA. In the present embodiment, this aperture 4 has a tapered cross-section. Alternatively, the apparatus may include more than one projection beam aperture 4.

The outer perimeter of the separator construction 3 is sealed from an enclosure 7 of the apparatus by seal assemblies 6. These seal assemblies 6 may be constructed in various ways, for example, the same as or similar to the seal assemblies described in U.S. Pat. No. 6,333,775, providing gas limiting seals between the first vacuum environment 1 and the second vacuum environment 2 at the respective locations.

In the present embodiment, the reticle MA forms at least part of a sealing construction (or seal) for substantially sealing the projection beam aperture 4 of the separator construction 3. As follows from FIGS. 4 and 5, in each scanning position, the reticle MA forms part of the sealing arrangement for substantially sealing the projection beam aperture 4 of the separator construction 3. More particularly, the reticle MA and the separator construction 3 are arranged to cooperate for providing a suitable seal of the aperture 4, particularly for preventing or reducing transmission of water and/or hydrocarbon contamination to the first vacuum environment 1. Therefore, the reticle MA is conveniently used for substantially sealing that aperture 4, so that contamination of the second vacuum environment and the reticle MA may be prevented. Thus, the first vacuum environment 1 may be pumped to relatively low pressures, particularly concerning water and/or hydrocarbon concentrations, with relative ease and in relatively short periods of time.

As is clearly visible in FIGS. 4 and 5, in the present embodiment, the reticle support MT is arranged to hold the reticle MA at a certain small distance from the separator construction 3 for sealing the aperture 4 thereof. This small distance is, for example, no more than about 1 mm, for sealing the aperture thereof. Preferable, the distance is no more than about 0.3 mm.

Furthermore, the reticle support MT and the separator construction 3 are also arranged to cooperate for the sealing of the aperture 4. Thus, in the present embodiment, the support of the reticle MA may also form part of the sealing construction for substantially sealing the aperture 4 of the separator construction 3. Particularly, the reticle support structure MT includes a sealing part 8 which is located at a certain small distance opposite a sealing part 9 of the separator construction 3. For example, the sealing part 8 of the reticle support structure MT extends at a distance of no more than about 1 mm from the sealing part 9 of the separator construction 3, measured in a transversal direction Z, for sealing the aperture thereof. The smallest transversal distance between the sealing parts 8, 9 is preferably no more than about 1 mm. The reticle MA is being held within an enclosure of the sealing part 8 of the reticle support structure MT. The sealing part 9 of the separator construction 3 surrounds the projection beam aperture 4 in the virtual X-Y plane, which plane is perpendicular to the transversal Z-direction and parallel to the reticle MA.

Because of the small distances between the reticle support structure MT and the reticle MA on one hand and the separator construction 3 on the other hand, relatively small slits 5 separate the first vacuum environment 1 from the second vacuum environment 2, as viewed from upper end of the projection beam aperture 4 of the separator construction 3. These small slits 5 are also gas conduction limiting seals. They may provide the advantage that the reticle MA may be held in vibrational isolation from the reticle stage metrology frame RS-MF, such that the reticle MA still assists in the sealing of the first vacuum environment 1 from the second vacuum environment 2.

Figure 6:
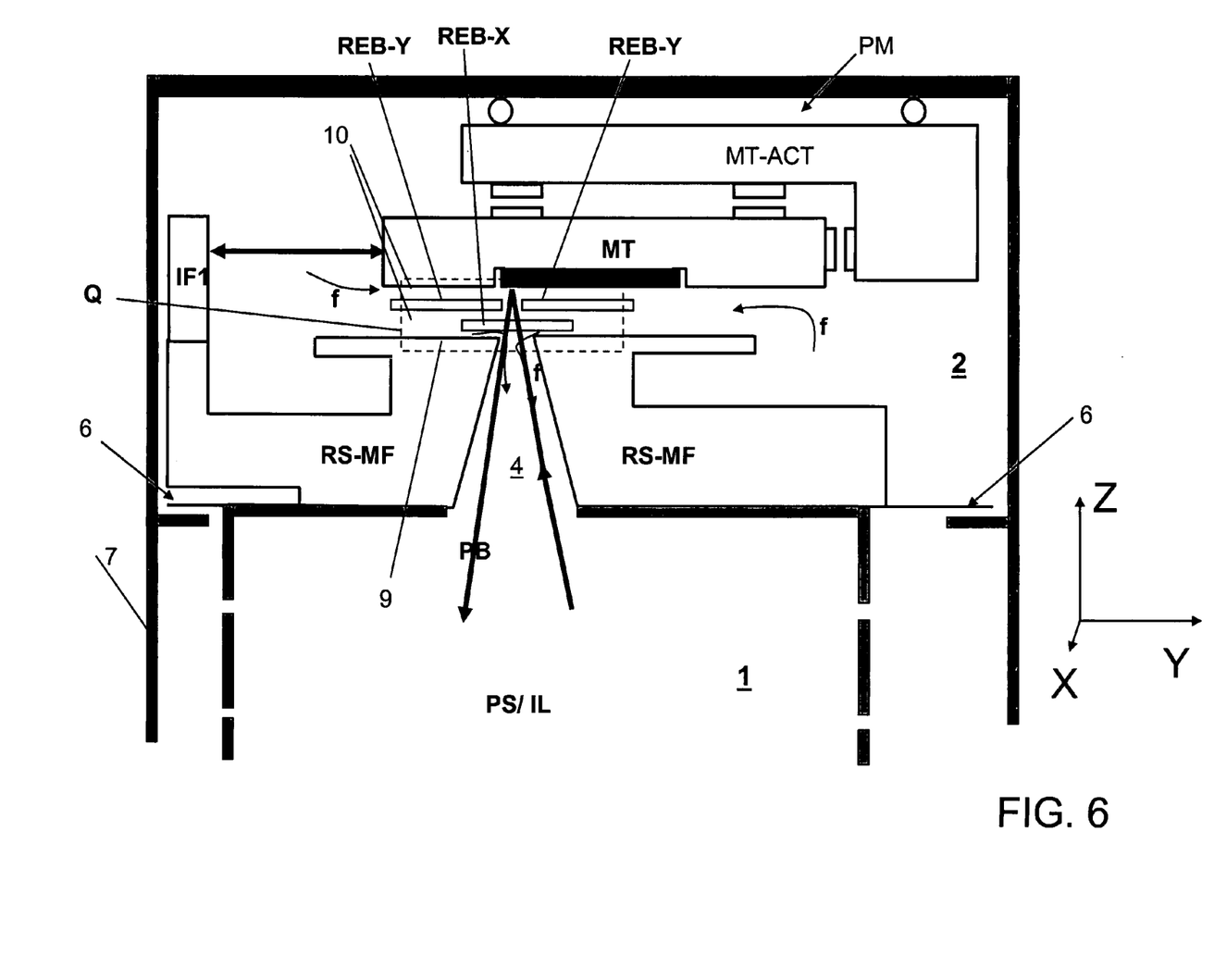
FIG. 6 a detail of a further embodiment of a lithographic apparatus, in cross-section, wherein the apparatus also includes rema-blades.
Figure 7:
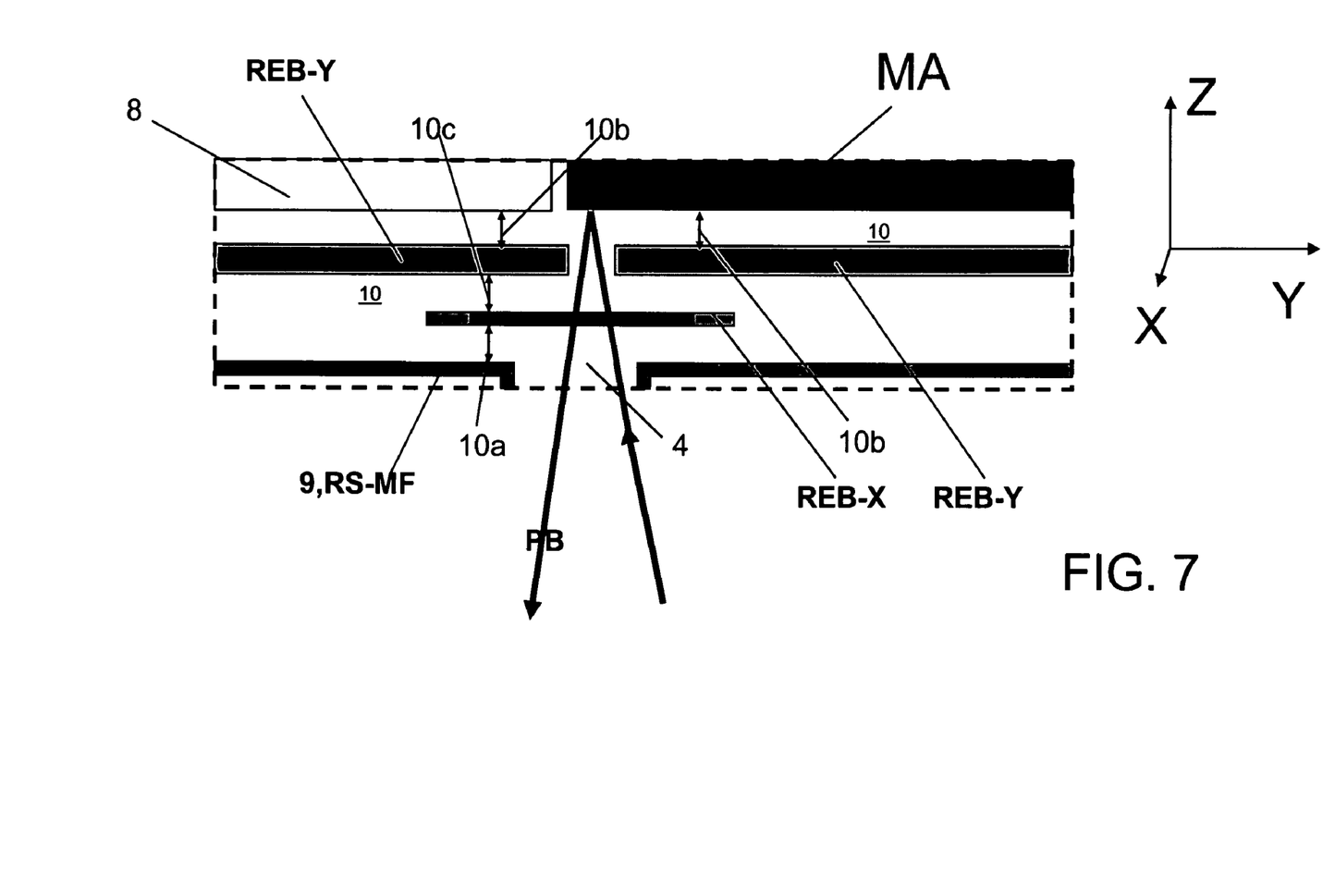
FIG. 7 a detail Q of FIG. 6.
Figure 8:
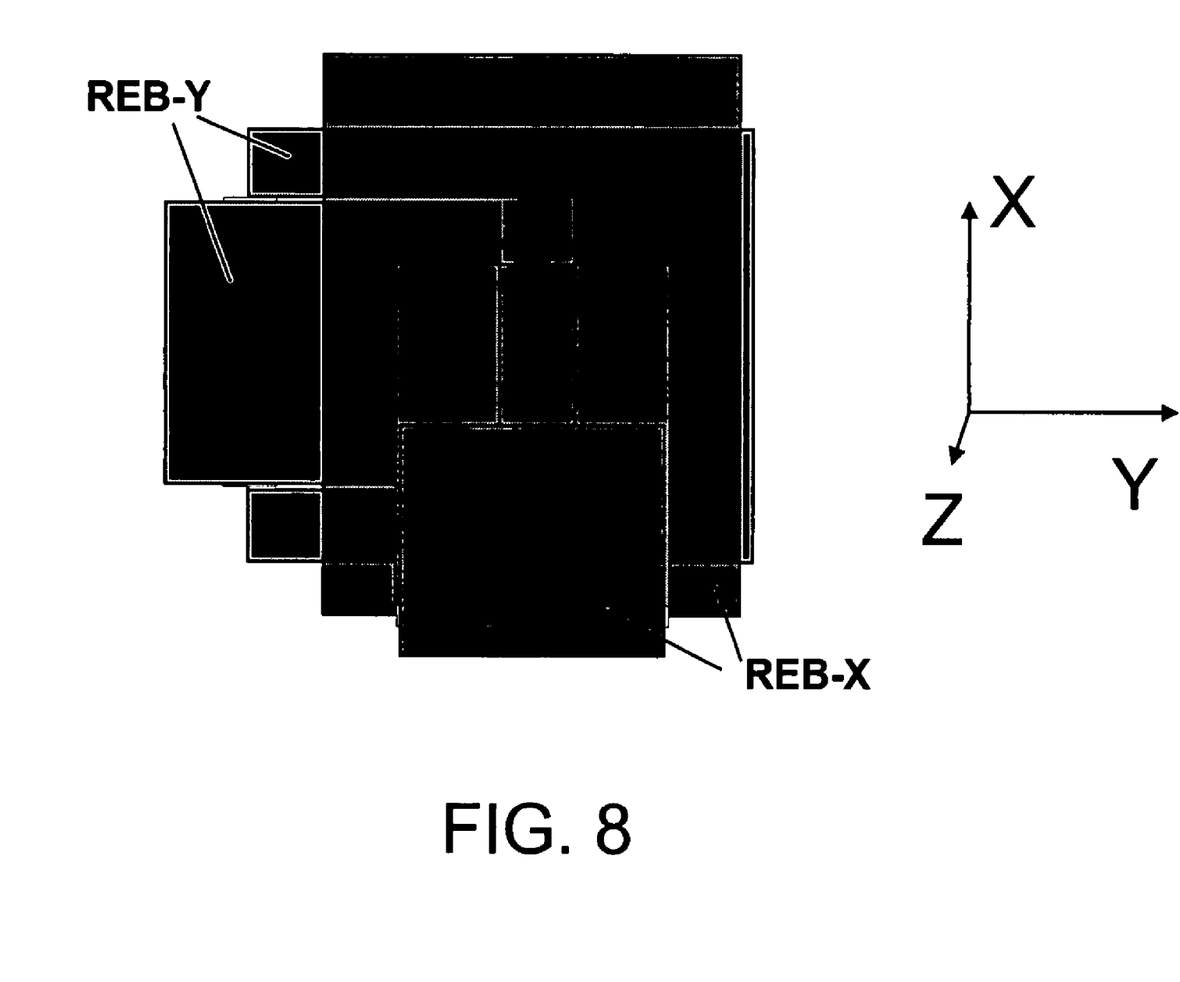
FIG. 8 is a bottom view of the REMA blade section of FIG. 6.

In an embodiment, the apparatus also includes blades REB for controlling the dimensions of the projection beam PB. As shown in FIGS. 6 and 7, such blades REB extend at least partially between the patterning device MA and the aperture 4 of the separator construction 3 during use. Preferable, the blades REB also provide at least part of the sealing of the aperture 4 of the separator construction 3, so that these blades REB are used as sealing members as well.

FIGS. 6 and 7 schematically shows X-Rema-blades REB-X and Y-Rema-blades REB-Y which are located near the reticle MA for controlling the shape of the projection beam in a X and Y directions, respectively. In the present embodiment, the Y-blades REB-Y are positioned nearer to the reticle MA than the X-blades REB-X, when viewed in the Z-direction.

For providing a sealing arrangement, the X-blades REB-X are located at a small distance 10*a* from the sealing part 9 of the separator construction 3, measured in the Z-direction. This last-mentioned distance is preferably not more than about 1 mm, and more preferably not more than about 0.3 mm.

Also, the Y-blades REB-Y are located at small distances 10*b* from the reticle MA and the sealing part 8 of the reticle support structure MT, for at least partially sealing the aperture 4 of the separator construction 3 at the respective location. The last-mentioned distance is also preferably no more than about 1 mm, and more preferably no more than about 0.3 mm, measured in the Z-direction.

The smallest distance 10*c* between the X-blades and Y-blades is preferably less than about 1 mm, and more preferably less than about 0.3 mm, when measured in the Z-direction.

The Rema blades, which are at the same level, may have the blades in one level, leading to a horizontal X-Y gap.

Following from the above, the embodiments of FIGS. 3–7 each include one or more small gaps 5, 10 extending between the reticle MA and the separator construction 3. In the present embodiments, the one or more small gaps extend substantially parallel to the reticle MA, between surfaces of the reticle MA, the opposite separator construction 3 and the optional Rema blades REB. Preferably, the size of each of the gaps is sufficiently small for limiting the flow of water and/or hydrocarbon from an outer side of the gap. The outer side of the gap joins the second vacuum environment 2, towards an inner side of the gap, which joins the aperture 4 of the separator construction. Such a gap provides good vibration isolation of the reticle stage, and also provides a good seal between the first and second vacuum chambers 11, 12, particularly concerning water and/or hydrocarbon contamination.

In the present embodiment, the reticle support structure MT is located substantially in the second vacuum environment 2. Therefore, the reticle support structure MT is located outside the optics zone 1, so that any contamination arising from the reticle support structure MT may be prevented from reaching the projection system PS relatively well. Also, in the present embodiment, the reticle positioner PM, including the reticle stage actuation module MT-ACT, is located substantially in the second vacuum environment 2. As shown in FIG. 3, the reticle handling system RH for handling the reticle MA is preferably located in the second vacuum environment 2 as well. This further reduces the volume to be pumped down to the low, first pressure, leading to shorter pumping times concerning the removal of water vapor and/or hydrocarbon from the first vacuum chamber 11 and/or lower vacuum levels. To this aim, the positioning sensors of the reticle stage measurement system, as shown in by reference sign IF1, may be provided in the second vacuum environment 2.

The sealing construction is preferably arranged such, that a gas conductance from the second vacuum environment 2 via the projection beam aperture 4 to the first vacuum environment 1 is lower than about 100 L/s. For example, the sealing construction can simply be arranged such that the mentioned gas conductance via the projection beam aperture 4 is lower than about 20 L/s. Therefore, the first vacuum environment 1 may be maintained at a desired low pressure, and relatively free from contamination. For example, and as a non-limiting example, the conductance for water at 22° C. can be only about 9.3 L/s when the sealing gap has a height of about 1 mm, a length of about 23 mm, and a width of about 416 mm.

The first and/or second vacuum environment may contain at least one inert gas, for example, helium, argon and/or the-like, that is the main contributor to the total pressure of the first and/or second vacuum environment. The partial pressures of water vapor and hydrocarbon are preferably much lower than the total pressure, for preventing contamination of the first vacuum environment 1.

As follows from above, the sealing construction preferably leads to relatively low partial pressures of hydrocarbon and water in the first vacuum chamber 12. Preferably, the partial pressure of water and/or hydrocarbon in the first vacuum environment 1 is at least about 100 times lower than the partial pressure of water and/or hydrocarbon in the second vacuum environment 2.

For example, the partial pressure of water in the second vacuum environment 2 may be about $10^{-5}$ mbar or smaller, during use. The partial pressure of water in the second vacuum environment 2 may be, for example, in the range of about $10^{-5-10-7}$ mbar Also, the partial pressure of hydrocarbon in the second vacuum environment 2 may be about $10^{-7}$ mbar or smaller. For example, the partial pressure of hydrocarbon in the second vacuum environment 2 may in the range of about $10^{-7-10-9}$ mbar. Then, the sealing arrangement may be arranged such that the partial pressure of water in the first vacuum environment 1 is about $10^{-7}$ mbar or smaller, whereas the partial pressure of hydrocarbon in the first vacuum environment 1 is about $10^{-9}$ mbar or smaller.

In one embodiment, the total pressure in the first vacuum environment 1 is about the same as the total pressure in the second vacuum environment 2. Thus, the occurrence of relatively high gas flows from the second to the first vacuum chamber may be prevented in a simple manner. For example, the total pressure of the second vacuum environment 2 may be in the range of about ½ to 1½ times the pressure of the first vacuum environment 1. This range may also be smaller, for example, about plus or minus 10% of the pressure of the first vacuum environment 1.

In an embodiment, the first vacuum environment 1 may have a lower total pressure than the second vacuum environment 2. For example, the first vacuum environment 1 may have a total pressure which is at least 1.5 and preferably minimally 10 times less than the total pressure of the second vacuum environment 2. By applying such a pressure difference, contamination of the optics in the first vacuum chamber 11 can be prevented well. In this way, vacuum requirements and the respective vacuum construction of the second vacuum chamber 12 may be less stringent.

The total pressure of gas in the second vacuum chamber 12 may be, for example, about $10^{-2}$ mbar or smaller. Further, the total pressure of gas in the first vacuum chamber 12 may be, for example, about $10^{-5}$ mbar or smaller.

Because of the above-described construction of the apparatus, the apparatus includes a movable seal for substantially sealing the projection beam aperture 4. Herein, the patterning device MA is simply part of the moving seal. The support for supporting the patterning device is also part of the moving seal. The moving seal may be movable, for example, over a distance in the range of 0–40 cm with respect to the separator construction 3. The control blades REB for controlling the dimensions of the projection beam PB may also form part of the seal of the projection beam aperture 4.

During use of the apparatus according to the present invention, the reticle MA is scanned between at least a first and a second position for imparting a pattern to the radiation beam PB. Particularly, during use, the reticle MA is moved at least between a first and a second position with respect to the aperture 4 of the separator construction 3, for scanning the projection beam over the reticle MA. This use may involve a device manufacturing method that includes projecting the patterned beam of radiation PB onto a substrate, wherein the first vacuum environment 1 and second vacuum environment 2 are kept are respective pressures. In this method, the patterning device MA is held at close distance near the projection beam aperture 4, simply for sealing that aperture 4. Preferably, the reticle MA is scanned along the upper end of the aperture 4, such that the reticle MA always covers the aperture 4 during the scanning process. Herein, the reticle MA is also held at a small distance from the separator construction 3. The sealing of the projection beam aperture 4 is also achieved during use by the described reticle support and by the optional control members REB for controlling the dimensions of the projection beam PB. Particularly, during use, the aperture 4 is sealed by the one or more small, vibration isolation gaps which extend between the reticle MA, the opposite separator construction 3 and intermediate control members REB.

Various pressures may be used in the first and second vacuum chamber, as has been mentioned above. Because of the sealing of the projection beam aperture 4, only small gas flows—if any— can reach that aperture 4 from the second vacuum environment 2. Such gas flows are depicted by arrows f in FIGS. 4 and 5. Small amount of gas may flow through the vibration isolation sealing assemblies 6, as has been indicated by arrows g. Such vibration isolation assemblies 6 can be sealed, for example, by foil, small gaps and the like. Thus, the first and second vacuum environments 1, 2 are separated relatively well from each other. Preferably, this separation is such that the partial pressure of water in the first vacuum environment 1 is about $10^{-7}$ mbar or smaller, whilst the partial pressure of hydrocarbon in the first vacuum environment 1 is about $10^{-9}$ mbar or smaller. It is preferred to allow higher partial pressures of these gasses in the second chamber 2, for example, at least about 10 times higher, than the partial pressures in the first chamber 1.

During use, the described operation of the apparatus may be at least partially controlled by the computer, computer program or computer program product. Such a controller CON may be arranged, for example, for controlling the positioning of the reticle MA with respect to the projection beam aperture 4 for substantially sealing that aperture 4, and the-like.

Because of the above-described arrangement of the apparatus of the present invention, contamination of the projection system may be prevented relatively well, leading to lower system down-times, longer optics lifetimes, better apparatus performance and improved devices manufactured thereby. Apparatus parts that do not have optical functionality, for example, EUV optical functions, are preferably placed outside the first vacuum environment 1, away from the optics of the projection system. Therefore, any outgassing of such apparatus parts will not —or only in very small amounts— affect the optics of the apparatus. Also, the optics zone 1 may be pumped down to a desired vacuum level relatively fast, and/or to lower vacuum pressure levels.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in, for example, a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example, imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5–20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
    a support constructed to support a patterning device, the patterning device being capable of imparting a radiation beam with a pattern in its cross-section to form a patterned radiation beam;
    a projection system configured to project the patterned radiation beam onto a target portion of a substrate;
    a first vacuum environment that contains said projection system;
    a second vacuum environment that contains said patterning device support;
    and
    a separator that separates the first vacuum environment and the second vacuum environment, the separator comprising an aperture for passing said projection beam from the first vacuum environment towards the patterning device and/or vice-versa,
    wherein said patterning device is arranged to form at least part of a seal for substantially sealing the first vacuum environment from the second vacuum environment at the aperture of the separator.

2. An apparatus according to claim 1, wherein the support is arranged to hold the patterning device at a distance of no more than about 1 mm from the separator for substantially sealing the first vacuum environment from the second vacuum environment at said aperture thereof.

3. An apparatus according to claim 1, wherein the support forms at least part of the seal for substantially sealing the first vacuum environment from the second vacuum environment at the aperture of the separator.

4. An apparatus according to claim 3, wherein the support comprises a sealing part which is located at a distance of no more than about 1 mm from a sealing part of the separator.

5. An apparatus according to claim 1, wherein blades for controlling the dimensions of said projection beam extend at least partially between said patterning device and the aperture of the separator, wherein said blades provide at least part of the sealing for substantially sealing the first vacuum environment from the second vacuum environment at the aperture of the separator.

6. An apparatus according to claim 5, wherein at least one of said blades is located at a distance of no more than about 1 mm from a sealing part of the separator for at least partially sealing the first vacuum environment from the second vacuum environment at the aperture of the separator.

7. An apparatus according to claim 5, wherein at least one of said blades is located at a distance of no more than about 1 mm from the patterning device and/or the support for at least partially sealing the first vacuum environment from the second vacuum environment at the aperture of the separator.

8. An apparatus according to claim 1, wherein at least one small gap extends between said patterning device and said separator, wherein the gap is configured to limit gas conductance of water and/or hydrocarbon from an outer side of the gap, said outer side joining the second vacuum environment towards an inner side of the gap, said inner side joining the aperture of the separator.

9. An apparatus according to claim 1, wherein said patterning device and said separator are arranged to cooperate for substantially sealing the first vacuum environment from the second vacuum environment at said aperture of said separator.

10. An apparatus according to claim 1, wherein said support and said separator are arranged to cooperate for substantially sealing the first vacuum environment from the second vacuum environment at said aperture of said separator.

11. An apparatus according to claim 1, wherein, during use, the patterning device moves at least between a first and a second position with respect to the aperture of the separator for scanning the projection beam over the patterning device.

12. An apparatus according to claim 1, wherein the support is arranged for moving the patterning device over a distance in the range of 0–0.4 m in a certain direction.

13. An apparatus according to claim 12, wherein said support, and a positioner thereof, are located substantially in said second vacuum environment.

14. An apparatus according to claim 1, wherein at least a reticle stage actuation module that is arranged for moving the patterning device over a relatively long distance in a certain direction is located substantially in said second vacuum environment.

15. An apparatus according to claim 1, wherein said seal is arranged such that a conductance from the second vacuum environment to the first vacuum environment is lower than about 100 L/s, and wherein said conductance is the conductance of water and/or hydrocarbons.

16. An apparatus according to claim 1, wherein said seal is arranged such that a conductance from the second vacuum environment to the first vacuum environment is lower than about 20 L/s, and wherein said conductance is the conductance of water and/or hydrocarbons.

17. An apparatus according to claim 1, wherein at least part of said seal moves with respect to the separator during use.

18. An apparatus according to claim 17, wherein the at least part of said seal that moves is movable over a distance in the range of 0–40 cm with respect to the separator during use.

19. An apparatus according to claim 1, wherein a reticle handling system for handling the reticle is located at least partially in the second vacuum environment.

20. An apparatus according to claim 1, wherein the partial pressure of water vapor in the second vacuum environment is about $10^{-5}$ mbar or smaller, and/or wherein the partial pressure of hydrocarbon in the second vacuum environment is about $10^{-7}$ mbar or smaller.

21. An apparatus according to claim 20, wherein the total pressure in the second vacuum environment is about $10^{-2}$ mbar or smaller.

22. An apparatus according to claim 1, wherein the total pressure in the first vacuum environment is about the same as the total pressure in the second vacuum environment, and wherein said total pressure is preferably about $10^{-2}$ mbar or smaller.

23. An apparatus according to claim 1, wherein the partial pressure of water vapor in the first vacuum environment is about $10^{-7}$ mbar or smaller, and/or wherein the partial pressure of hydrocarbon in the first vacuum environment is about $10^{-9}$ mbar or smaller.

24. An apparatus according to claim 23, wherein the total pressure in the first vacuum environment is about $10^{-5}$ mbar or smaller.

25. An apparatus according to claim 1, further comprising an illumination system configured to condition the radiation beam.

26. An apparatus according to claim 1, further comprising a substrate table constructed to hold the substrate.

27. A lithographic apparatus comprising:
  a support constructed to support a patterning device, the patterning device being capable of imparting a radiation beam with a pattern in its cross-section to form a patterned radiation beam;
  a projection system configured to project the patterned radiation beam onto a target portion of a substrate;
  a first vacuum environment that contains said projection system;
  a second vacuum environment that contains said patterning device support; and
  a separator that separates the first vacuum environment and the second vacuum environment, the separator comprising an aperture for passing said projection beam from the first vacuum environment towards the patterning device and/or vice-versa,
  a plurality of blades for controlling the dimensions of said projection beam, said blades extending at least partially between said patterning device and the aperture of the separator,
  wherein said patterning device and said blades are arranged for substantially sealing the first vacuum environment from the second vacuum environment at the aperture of the separator.

28. An apparatus according to claim 27, wherein at least one of said blades is located at a distance of less than about 1 mm from a sealing part of the separator for at least partially sealing the first vacuum environment from the second vacuum environment at the aperture of the separator.

29. An apparatus according to claim 27, wherein at least one of said blades is located at a distance of less than about 1 mm from the patterning device and/or the support for at least partially sealing the first vacuum environment from the second vacuum environment at the aperture of the separator.

* * * * *